United States Patent
Sutou et al.

(10) Patent No.: US 8,598,563 B2
(45) Date of Patent: Dec. 3, 2013

(54) PHASE-CHANGE MATERIAL AND PHASE-CHANGE TYPE MEMORY DEVICE

(75) Inventors: Yuji Sutou, Sendai (JP); Junichi Koike, Sendai (JP); Yuta Saito, Sendai (JP); Toshiya Kamada, Sendai (JP)

(73) Assignee: Tohoku University, Miyagi (JP)

( * ) Notice: Subject to any disclaimer, the term of this patent is extended or adjusted under 35 U.S.C. 154(b) by 0 days.

(21) Appl. No.: 13/395,424

(22) PCT Filed: Sep. 9, 2010

(86) PCT No.: PCT/JP2010/065991
§ 371 (c)(1), (2), (4) Date: May 11, 2012

(87) PCT Pub. No.: WO2011/030916
PCT Pub. Date: Mar. 17, 2011

(65) Prior Publication Data
US 2012/0235110 A1    Sep. 20, 2012

(30) Foreign Application Priority Data
Sep. 11, 2009  (JP) ................... 2009-210881

(51) Int. Cl.
*H01L 45/00* (2006.01)

(52) U.S. Cl.
USPC ............ 257/4; 257/E45.002; 257/E21.004; 365/148; 365/163; 438/382

(58) Field of Classification Search
USPC ........... 257/4, E45.002, E21.004; 365/148; 365/163; 438/382
See application file for complete search history.

(56) References Cited

U.S. PATENT DOCUMENTS

| 6,850,432 B2* | 2/2005 | Lu et al. ............ 365/163 |
| 2005/0045864 A1 | 3/2005 | Tanaka et al. |

FOREIGN PATENT DOCUMENTS

| JP | 2008-135659 | 6/2008 |
| JP | 2008-235863 | 10/2008 |
| JP | 2009-37703 | 2/2009 |
| JP | 2009-289962 | 12/2009 |
| JP | 2010-103302 | 5/2010 |
| JP | 2010-232229 | 10/2010 |
| WO | WO 03/050872 A1 | 6/2003 |

OTHER PUBLICATIONS

International Search Report, dated Dec. 21, 2010, corresponding to PCT/JP2010/065991, 3 pages.

* cited by examiner

*Primary Examiner* — Zandra Smith
*Assistant Examiner* — Paul Patton
(74) *Attorney, Agent, or Firm* — Christie, Parker & Hale, LLP

(57) ABSTRACT

A phase-change material, which has a high crystallization temperature and is superior in thermal stability of the amorphous phase, which has a composition of the general chemical formula $Ge_xM_yTe_{100-x-y}$ wherein M indicates one type of element which is selected from the group which comprises Al, Si, Cu, In, and Sn, x is 5.0 to 50.0 (at %) and y is 4.0 to 45.0 (at %) in range, and x and y are selected so that 40 (at %)$\leq$x+y$\leq$60 (at %). This phase-change material further contains, as an additional element L, at least one type of element L which is selected from the group which comprises N, O, Al, Si, P, Cu, In, and Sn in the form of $Ge_xM_yL_zTe_{100-x-y-z}$ wherein z is selected so that 40 (at %)$\leq$x+y+z$\leq$60 (at %).

21 Claims, 12 Drawing Sheets

FIG.1A

| | Te (at.%) | Ge (at.%) | ELEMENT M (AT%) | ADDITIONAL ELEMENT L (AT%) | CRYSTALLIZATION TEMPERATURE TC (°C) | ACTIVATION ENERGY (EV) | MELTING POINT TM (°C) | ELECTRICAL RESISTANCE RATIO ΔR |
|---|---|---|---|---|---|---|---|---|
| EX. 1 | 47.5 | 47.5 | Al : 5.0 | 0.0 | 222 | 3.1 | 690 | $7 \times 10^6$ |
| EX. 2 | 44.0 | 45.0 | Al : 11.0 | 0.0 | 262 | 3.3 | 705 | $7 \times 10^5$ |
| EX. 3 | 47.0 | 46.0 | Al : 6.0 | Sn : 1.0 | 230 | 3.6 | 695 | $5 \times 10^6$ |
| EX. 4 | 45.1 | 44.2 | Al : 10.2 | In : 0.5 | 270 | 3.3 | 708 | $6 \times 10^5$ |
| EX. 5 | 54.0 | 41.9 | Si : 4.1 | 0.0 | 201 | 3.3 | 720 | $7 \times 10^5$ |
| EX. 6 | 44.6 | 45.2 | Si : 10.2 | 0.0 | 291 | 3.5 | 690 | $9 \times 10^3$ |
| EX. 7 | 49.1 | 37.7 | Si : 13.2 | 0.0 | 290 | 3.5 | 700 | $1 \times 10^4$ |
| EX. 8 | 45.2 | 44.2 | Si : 10.1 | O : 0.5 | 298 | 3.7 | 700 | $1 \times 10^3$ |
| EX. 9 | 51.5 | 40.5 | Cu : 8.0 | 0.0 | 230 | 3.3 | 570 | $2 \times 10^6$ |
| EX. 10 | 59.1 | 23.8 | Cu : 17.1 | 0.0 | 202 | 3.3 | 512 | $4 \times 10^5$ |
| EX. 11 | 50.5 | 20.4 | Cu : 29.1 | 0.0 | 208 | 3.4 | 541 | $2 \times 10^3$ |
| EX. 12 | 50.0 | 16.7 | Cu : 33.3 | N : 1.0 | 200 | 3.4 | 542 | $3 \times 10^2$ |
| EX. 13 | 50.5 | 16.5 | Cu : 32.0 | O : 0.5 | 225 | 3.5 | 580 | $4 \times 10^2$ |
| EX. 14 | 51.5 | 18.0 | Cu : 30.0 | Al : 4.5 | 220 | 3.5 | 595 | $5 \times 10^2$ |
| EX. 15 | 49.8 | 17.2 | Cu : 28.5 | Al : 2.0 | 220 | 3.6 | 560 | $2 \times 10^3$ |
| EX. 16 | 48.0 | 22.0 | Cu : 27.5 | N : 0.5 | 213 | 3.8 | 573 | $3 \times 10^2$ |
| EX. 17 | 47.3 | 12.0 | Cu : 33.2 | Si : 7.5 | 226 | 3.9 | 595 | $2 \times 10^3$ |
| EX. 18 | 49.0 | 18.0 | Cu : 31.0 | P : 2.0 | 230 | 3.3 | 578 | $2 \times 10^2$ |
| EX. 19 | 50.5 | 25.5 | In : 24.0 | 0.0 | 210 | 3.2 | 755 | $3 \times 10^4$ |

FIG.1B

| | Te (at.%) | Ge (at.%) | ELEMENT M (AT%) | ADDITIONAL ELEMENT L (AT%) | CRYSTALLIZATION TEMPERATURE TC (°C) | ACTIVATION ENERGY (EV) | MELTING POINT TM (°C) | ELECTRICAL RESISTANCE RATIO $\Delta R$ |
|---|---|---|---|---|---|---|---|---|
| EX. 20 | 48.5 | 16.8 | In : 34.2 | Cu : 0.5 | 201 | 3.4 | 660 | $3 \times 10^3$ |
| EX. 21 | 45.3 | 44.5 | Sn : 10.2 | 0.0 | 200 | 3.6 | 705 | $3 \times 10^4$ |
| EX. 22 | 49.6 | 16.5 | Cu : 33.0 | Si : 0.86 | 205 | 3.3 | 550 | $7 \times 10^2$ |
| EX. 23 | 47.0 | 15.6 | Cu : 31.4 | Si : 6.19 | 225 | 3.3 | 605 | $4 \times 10^2$ |
| EX. 24 | 44.5 | 14.8 | Cu : 29.6 | Si : 11.1 | 243 | 3.4 | 650 | $2 \times 10^2$ |
| EX. 25 | 43.2 | 14.4 | Cu : 28.8 | Si : 13.6 | 230 | 3.6 | 685 | $2 \times 10^2$ |
| EX. 26 | 41.7 | 13.7 | Cu : 27.4 | Si : 17.2 | 220 | 3.6 | 720 | $1 \times 10^2$ |
| EX. 27 | 56.1 | 6.4 | Cu : 12.8 | Si : 24.7 | 250 | 5.2 | 522 | $7 \times 10^3$ |
| EX. 28 | 54.4 | 9.2 | Cu : 18.5 | Si : 17.9 | 215 | 6.0 | 504 | $3 \times 10^4$ |
| EX. 29 | 52.9 | 11.8 | Cu : 23.8 | Si : 11.5 | 220 | 5.3 | 560 | $1 \times 10^4$ |
| EX. 30 | 50.0 | 5.6 | Cu : 33.3 | Si : 11.1 | 190 | 3.5 | 650 | $1 \times 10^2$ |
| EX. 31 | 50.0 | 8.3 | Cu : 33.4 | Si : 8.3 | 215 | 3.8 | 610 | $9 \times 10^2$ |
| EX. 32 | 50.0 | 11.1 | Cu : 33.3 | Si : 5.6 | 213 | 3.7 | 560 | $2 \times 10^3$ |
| COMP. EX. 1 | 50.0 | 50.0 | 0.0 | 0.0 | 185 | 2.9 | 724 | $2 \times 10^6$ |
| COMP. EX. 2 | 55.6 | 22.2 | 0.0 | Sb : 22.2 | 159 | 2.3 | 640 | $3 \times 10^4$ |
| COMP. EX. 3 | 94.0 | 3.0 | Cu : 3.0 | 0.0 | 103 | 2.9 | 440 | $3 \times 10^3$ |
| COMP. EX. 4 | 70.0 | 7.0 | Si : 23.0 | 0.0 | 185 | 2.9 | 1010 | $1 \times 10^3$ |
| COMP. EX. 5 | 48.0 | 5.0 | Si : 47.0 | 0.0 | 205 | — | — | $1 \times 10^1$ |

PHASE-CHANGE MATERIAL AND PHASE-CHANGE TYPE MEMORY DEVICE

CROSS-REFERENCE TO RELATED APPLICATION

This application is a National Phase Patent Application and claims the priority of International Application Number PCT/JP2010/065991, filed on Sep. 9, 2010, which claims priority of Japanese Patent Application Number 2009-210881, filed on Sep. 11, 2009.

TECHNICAL FIELD

The present invention relates to a phase-change material which is suitable for a phase-change type memory device and to a phase-change type memory device which uses that material.

BACKGROUND ART

In recent years, along with the rapid expansion of the market for mobile phones and other mobile type electronic devices, magnetoresistive memories (MRAM: magnetoresistive random access memories), ferroelectric memories (FeRAM: ferroelectric random access memories), phase-change type memories (PCRAM: phase-change random access memories), etc. have become the subject of active R&D as next generation nonvolatile memories for taking the place of flash memories. Among these, PCRAM's feature memory cells with simple structures, so are superior in not only manufacturing costs, but also integration degree compared with other memories.

A phase-change material is used for the data recording layer of a PCRAM. Data is recorded utilizing the change in electrical resistance which accompanies a phase change between an amorphous phase (high resistance) and a crystal phase (low resistance) of the phase-change material.

The electrical resistance ratio between the amorphous phase and crystal phase has to be made $10^2$ or more so as to raise the data reading precision.

A phase-change material in the amorphous phase state changes to a crystal phase state by being heated to the crystallization temperature Tc or more. Further, a phase-change material in the crystal phase state changes to the amorphous phase state by being heated to a melting point Tm higher than the crystallization temperature Tc, then rapidly cooling.

For the phase change of the phase-change material between the amorphous phase and crystal phase, the Joule's heat due to application of current or voltage is utilized to heat the material, for example, to the melting point Tm or more to change it to the high resistance state amorphous phase and thereby set the reset state or to heat the material to the crystallization temperature Tc to less than the melting point Tm to change it to the low resistance state crystal phase and thereby set the set state so as to record data.

At the present time, as the PCRAM-use phase-change material, the $Ge_2Sb_2Te_5$ (GST) which is being used for DVD-RAM's is being broadly studied (for example, see NPLT's 1 and 2).

On the other hand, along with the higher performance of the device, further thermal stability of the phase-change material is sought. In particular, starting 2011, the guaranteed operating temperature of the PCRAM device is made 125° C. for 10 years (see NPLT 3). If the phase-change material in the amorphous phase state is allowed to stand for a long period of time, sometimes the material will change to the crystal phase on its own. Due to this change, the data retention is impaired. Therefore, to achieve the above-mentioned guaranteed operating temperature, it is necessary to raise the crystallization temperature Tc of the phase-change material and to increase the activation energy when the amorphous phase crystallizes so as to raise the thermal stability of the amorphous phase. On the other hand, if the melting point of the phase-change material is high, a problem arises in that the energy (power) which is required for change from the crystal phase to the amorphous phase becomes larger, so a lower melting point is preferable.

PLT 1 discloses a nonvolatile memory which uses a GeSbTe compound as a phase-change material. However, the melting point Tm of the GeSbTe compound is a relatively high 620° C. or so, but despite this the crystallization temperature Tc is a relatively low one of about 160° C. or so (for example, PLT 2). Further, the activation energy of crystallization of the amorphous phase of a GeSbTe compound is about 1.5 to 2.2 eV (for example, NPLT 4), therefore the thermal stability of the amorphous phase is low and the data retention property can become fragile.

PLT 2 has as its object the provision of a phase-change substance layer which has a high crystallization temperature, has a low melting point, and is thermally and structurally stable and discloses a phase-change substance layer which comprises a four-component compound layer which includes indium, in particular, $In_aGe_bSb_cTe_d$ (where, 15 (at %)≤a≤20 (at %), 10 (at %)≤b≤15 (at %), 20 (at %)≤c≤25 (at %), 40 (at %)≤d≤55 (at %)). That is, PLT 2 discloses a phase-change substance layer with a higher crystallization temperature than GeSbTe, but there is no description of the activation energy of crystallization which shows the thermal stability of the amorphous phase. Further, for measurement of the crystallization temperature, measurement of the reflectance is used. There is no description regarding the electrical resistance ratio between the amorphous phase and crystal phase. The thermal stability of the amorphous phase and data reading precision are unknown.

As a phase-change material which has a high crystallization temperature or has a high activation energy, PLT 3 discloses a phase-change material which comprises Sb and Te as main ingredients and at least one type of element added as additional elements. As additional elements, B, C, N, Ag, In, P, and Ge are described. That is, PLT 3 discloses a phase-change material which is comprised of Sb and Te as main ingredients and has at least one type of element added to it as additional elements wherein a 160° C. or higher crystallization temperature and a 2.5 eV or higher activation energy of crystallization is obtained. The examples of PLT 3 describe a phase-change material comprised of an $Sb_{75}Te_{25}$ alloy containing additional elements of N, Ge, B, P, and Ag. However, the phase-change material described in PLT 3 was invented as a phase-change recording material for an optical recording medium. There is no description regarding the electrical resistance ratio between the amorphous phase and crystal phase at all. Further, Te is a semiconductor, while the main ingredient Sb is a half metal, so the electrical resistance of the phase-change recording material is low. If used as a PCRAM memory device, there are the defects that the device resistance is low and the drive current for crystallization and amorphization easily becomes large (for example, see NPLT 5).

PLT 4 discloses a phase-change memory device which contains one or more elements which are selected from the group which comprises Te, Se, Ge, Sb, Bi, Pb, Sn, As, S, Si, P, O, and mixtures or alloys of the same. That is, PLT 4 describes a phase-change material where the ratio of ingredients of Te, Ge, and Sb is $Te_aGe_bSb_{100-(a+b)}$ (a<70 (at %), b>5 (at %)), $(Te_aGe_bSb_{100-(a+b)})_cTM_dSe_{100-c}$ (a<70 (at %), b>5 (at %), 90 (at %)<c<99.99 (at %), and TM is one or more transition metals), and $(Te_aGe_bSb_{100-(a+b)})_cTM_dSe_{100-(c+d)}$ (a<70 (at %), b>5 (at %), 90 (at %)<c<99.5 (at %), 0.01 (at %)<d<10.0 (at %), and TM is one or more transition metals). However, there is no description regarding the crystallization temperature or the activation energy of crystallization of the amorphous phase and there is no description of the thermal stability of the phase-change material. Further, there is no description at all relating to the electrical resistance ratio between an amorphous phase and crystal phase.

Further, NPLT 6 describes a Ge—Bi—Te phase-change material. According to NPLT 6, it is described that in a phase-change material which is comprised of Ge—Bi—Te, a 240° C. or more crystallization temperature is obtained. However, there is no description relating to the activation energy of crystallization of the amorphous phase and thermal stability. Further, there is also no description relating to the electrical resistance ratio between an amorphous phase and crystal phase.

As explained above, among the already proposed phase-change materials, there is no material able to sufficiently withstand practical use which satisfies the requirements which are sought from materials of PCRAM memory devices such as 1) the high thermal stability of the amorphous phase and high data retention capability and, more preferably, 2) the low melting point and small energy (drive power) which is required for change from the crystal phase to the amorphous phase.

CITATIONS LIST

Patent Literature

PLT 1: Japanese Patent No. 3896576
PLT 2: Japanese Patent Publication (A) No. 2008-177570
PLT 3: Japanese Patent Publication (A) No. 2000-343830
PLT 4: Japanese Patent Publication (A) No. 2002-512439

Nonpatent Literature

NPLT 1: "*Next Generation Optical Recording Technology and Materials*", supervised by M. Okada, CMC Shuppan, 2004
NPLT 2: "*Newest Technology in Next Generation Semiconductor Memory*", supervised by M. Koyanagi, CMC Shuppan, 2009
NPLT 3: "*International Technology Roadmap for Semiconductors*", 2007 Edition, Front End Processes
NPLT 4: N. Yamada et al. *J. Appl. Phys.*, 69, (5) (1991) p. 2849
NPLT 5: M. Terao, Phase-Changing Memories—(PRAM), *Applied Physics*, vol. 75, no. 9 (2006), p. 1098
NPLT 6: CW. Sun et al., *J. Phys.: Condens. Matter*, 19 (2007), 446004

SUMMARY OF INVENTION

Technical Problem

The present invention was made for the purpose of alleviating the problems of the conventional phase-change materials explained above and has as its task to provide a phase-change material which has a novel composition which is suitable for a phase-change type memory device which is excellent in practicality and to provide a phase-change type memory device which uses that material.

Solution to Problem

As a result of in-depth research in consideration of the above object, the inventors obtained the discovery that in a material which contains Ge and Te and further contains one type of element which is selected from the group which comprises Al, Si, Cu, In, and Sn, an amorphous phase is obtained and a high crystallization temperature is obtained.

Based on this discovery, in one aspect of the present invention, there is provided a phase-change material which has a composition of the general chemical formula $$Ge_xM_yTe_{100-x-y}$$

wherein M indicates one type of element which is selected from the group which comprises Al, Si, Cu, In, and Sn, x is 5.0 to 50.0 (at %) and y is 4.0 to 45.0 (at %) in range, and x and y are selected so that 40 (at %)≤x+y≤60 (at %).

The phase-change material may further contain, as an additional element L, at least one type of element L which is selected from the group which comprises N, O, Al, Si, P, Cu, In, and Sn in the form of $$Ge_xM_yL_zTe_{100-x-y-z}$$

wherein z is selected so that 40 (at %)≤x+y+z≤60 (at %).

Furthermore, when the selected one type of element M is Cu, the y may be 4.0 to 38.0 (at %).

When the selected one type of element M is Al, the y may be 4.0 to 15.0 (at %).

When the selected one type of element M is Si, the y may be 4.0 to 15.0 (at %).

When the selected one type of element M is Cu and the additional element L is Si, the y may be 10.0 to 38.0 (at %) and the z may be 0.5 to 30 (at %).

When the selected one type of element M is In, the y may be 20.0 to 40.0 (at %).

When the selected one type of element M is Sn, the y may be 4.0 to 15.0 (at %).

In a second aspect of the present invention, there is provided a phase-change type memory device which is provided with a substrate, a memory layer which is formed by a phase-change material of the first aspect on the top of the substrate, and first and second electrodes for conduction to the memory layer.

In the phase-change type memory device of the second aspect, the first and second electrodes may be formed on the substrate in proximity to the two ends of the memory layer.

Further, the first electrode may be formed by a bottom electrode layer and heat-generating electrode layer which are formed on the substrate, and the second electrode may be formed on the memory layer.

Further, a diffusion barrier layer may be formed between the memory layer and at least the substrate.

Advantageous Effects of Invention

In the phase-change material according to the present invention, the electrical resistance ratio between the amorphous phase and crystal phase is $10^2$ or more, the crystallization temperature is a high 190° C. or more, and the activation energy of crystallization of the amorphous phase is 3.0 eV or more. Therefore, the amorphous phase thermal stability of the material becomes extremely high. Further, the melting point of this material is relatively low and the energy which is required for changing the crystal phase to the amorphous phase becomes small. As a result, it becomes possible to use this material to form a highly practical phase-change type memory device.

BRIEF DESCRIPTION OF DRAWINGS

FIG. 1A is a view which shows compositions of phase-change materials and their physical properties according to various embodiments of the present invention in a table form.

FIG. 1B is a view which shows compositions of phase-change materials and their physical properties according to further embodiments of the present invention and comparative examples in a table form.

DESCRIPTION OF EMBODIMENTS

Figure 2A:
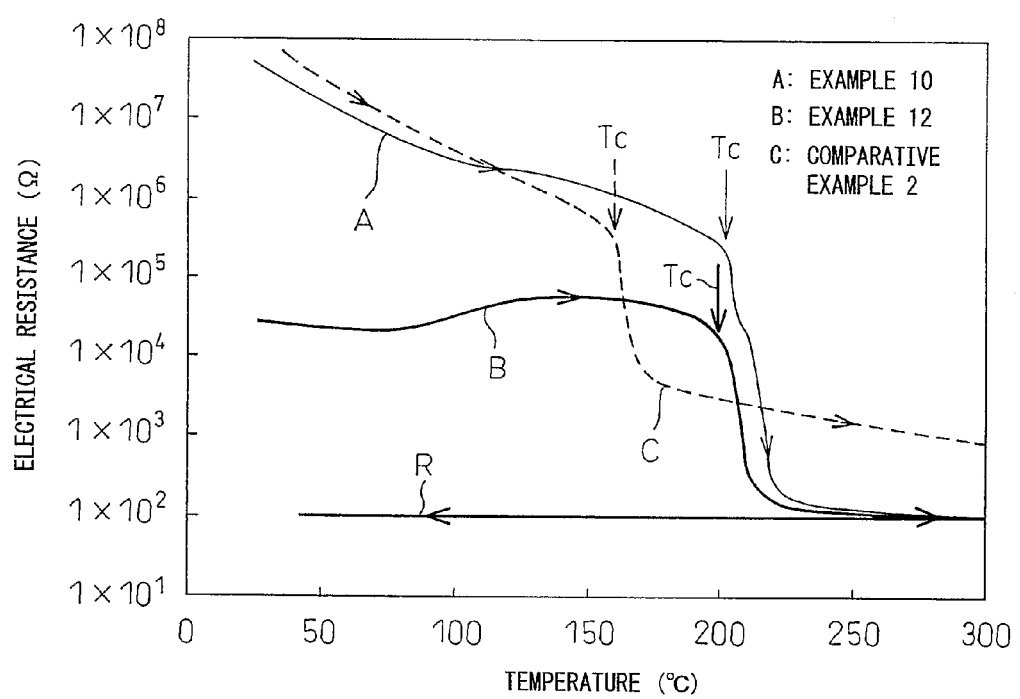
FIG. 2A is a graph which shows temperature dependencies of electrical resistances of thin films of phase-change materials according to various embodiments of the present invention.

The inventors etc. engaged in various experiments in the pursuit of a GeTe-based phase-change material which does not contain Sb and further gives a high crystallization temperature and has a large activation energy accompanying crystallization and as a result discovered that it is possible to achieve the object of the present invention in a material having the features explained below. Part of the results of the experiments run by the inventors etc. is shown in FIGS. 1A and 1B explained below. Note that, in the examples which are shown below, a material with a crystallization temperature Tc of the phase-change material of 190° C. or more and with an activation energy of crystallization of the amorphous phase of 3.0 eV or more is deemed a phase-change material which achieves the object of the present invention.

The phase-change material of the present invention is a material which contains Ge and Te and furthermore contains one type of element which is selected from the group which comprises Al, Si, Cu, In, and Sn wherein Ge and Te are contained in a total concentration of 50 (at %) or more. In particular, in the phase-change material expressed by the following chemical formula, a high crystallization temperature is obtained and the activation energy accompanying crystallization is large.

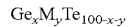   Chemical formula 1

M: one type of element which is selected from the group which comprises Al, Si, Cu, In, and Sn x, y indicate atomic concentrations (at %), where x is 5.0 to 50.0 and y is 4.0 to 45.0 in range and x and y are selected so that 40 (at %)≤x+y≤60 (at %).

The reason for making Ge 5.0 (at %) to 50.0 (at %) is that if less than 5.0 (at %), the crystallization temperature and the activation energy of crystallization are low and sufficient thermal stability of the amorphous phase is not obtained, while if over 50.0 (at %), amorphization becomes difficult. The reason for making the one type of element which is selected from the group which comprises Al, Si, Cu, In, and Sn 4.0 (at %) to 45.0 (at %) is that, if less than 4.0 (at %), the crystallization temperature is low, while if over 45.0 (at %), in the case of the metal and half metal elements of Al, Cu, In, and Sn, the electrical resistance becomes low and, in the case of the semiconductor element of Si, a $10^2$ or more change in resistance can no longer be obtained.

Furthermore, in the chemical formula $Ge_xCu_yTe_{100-x-y}$, 5.0≤x≤45.0 and 4.0≤y≤38.0 are preferable. Due to this, a high crystallization temperature and a 600° C. or less melting point are obtained.

Furthermore, in the chemical formula $GeAl_yTe_{100-x-y}$, 35.0≤x≤48.0, 4.0≤y≤15.0 are more preferable. Due to this, the crystallization temperature can be raised more.

Furthermore, in the chemical formula $Ge_xSi_yTe_{100-x-y}$, 35.0≤x≤48.0 and 4.0≤y≤15.0 are more preferable. Due to this, a crystal phase with a high electrical resistivity is obtained.

Furthermore, in the chemical formula $Ge_xIn_yTe_{100-x-y}$, 12.0≤x≤30.0 and 20.0≤y≤40.0 are preferable. Due to this, the melting point can be lowered more.

Furthermore, in the chemical formula $Ge_xSn_yTe_{100-x-y}$, 35.0≤x≤48.0 and 4.0≤y≤15.0 are preferable. Due to this, the crystallization temperature can be raised more.

The phase-change material of the present invention may, in accordance with need, further contain one or more elements L (additional elements) which are selected from the group which is comprised of N, O, Al, Si, P, Cu, In, and Sn. In this case, the additional elements L are contained in the form of the chemical formula $Ge_xM_yL_zTe_{100-x-y-z}$ and the range of z is selected to give 40 (at %)≤x+y+z≤60 (at %). In particular, N: 0.1 to 5.0 (at %), O: 0.1 to 5.0 (at %), and Al, P, Cu, In, and Sn: 0.1 to 10.0 (at %) is more preferable. Regarding Si, when selecting Cu as the element M, the amount of Si which is added as an element L is suitably 0.5 (at %) to 30 (at %) in range. The reasons for the numerical limitations of the more preferable ingredients to raise the effect of the added elements are as follows.

Regarding N, the reason for making it 0.1 to 5.0 (at %) is that, if less than 0.1 (at %), the effect of addition for raising the crystallization temperature is small, while if over 5.0 (at %), the melting point ends up becoming higher. Further, regarding O, the reason for making it 0.1 to 5.0 (at %) is that, if less than 0.1 (at %), the effect of raising the crystallization temperature is small, while if over 5.0 (at %), due to the formation of oxides, phase change ends up no longer occurring. Furthermore, regarding the addition of Al, P, Cu, In, and Sn, to stabilize the amorphous phase, it is effective to make the crystallization temperature rise. The range is made 0.1 to 10.0 (at %) because if less than 0.1 (at %), there is no effect of addition, while if over 10.0 (at %), there is the problem that the melting point ends up becoming high, so the upper limit is made 10.0 (at %).

Furthermore, regarding the addition of Si, the range of z is more preferably 0.5 (at %) to 30.0 (at %). The addition of Si is effective for making the crystallization temperature rise and increasing the electrical resistance ratio of the amorphous phase and crystal phase. The reason for setting this to 0.5 (at %) to 30 (at %) in range is that if less than 0.5 (at %), there is no effect of addition, while if over 30 (at %), a $Si_2Te_3$ phase etc. is formed, so there is the problem that the electrical resistance ratio of the amorphous phase and crystal phase ends up becoming smaller, therefore the upper limit is made 30.0 (at %).

By forming the phase-change material of the present invention on a substrate, a phase-change type nonvolatile memory device is obtained. In particular, the nonvolatile memory device preferably has an insulating layer and a phase-change material layer which is formed on the insulating layer, contains an electrode layer which is formed at the two ends of the phase-change material layer, and has the exposed parts of the phase-change material layer covered by the insulating layer. As the electrode layer, W, TiN, Al, Cu, etc. may be mentioned.

Furthermore, by having a bottom electrode layer which is formed on a substrate and a phase-change material layer which is formed on the bottom electrode layer, containing a top electrode layer which is formed on the phase-change material layer, and having the exposed parts of the phase-change material layer covered by the insulating layer, a phase-change type nonvolatile memory device is obtained. Further, it is more preferable that there be a heat-generating electrode layer between the bottom electrode layer and the phase-change material layer. As the heat generating electrode layer, W, TiW, TiN, and other nitrides or oxides etc. may be mentioned.

Furthermore, it is possible to form a diffusion barrier layer between the phase-change material layer and at least the insulating layer. Due to this, it is possible to suppress inter diffusion between the insulating layer and phase-change material layer and possible to eliminate mistaken operation. As the diffusion barrier layer, various types of nitrides, oxides, etc. may be mentioned, but in particular an Mn oxide layer is preferable.

As the method of production of the material of the present invention, various types of targets within ranges of composition containing Ge and Te in a total of 50.0 (at %) and furthermore one type of element which is selected from the group which comprises Al, Si, Cu, In, and Sn are used for physical vapor deposition (sputtering etc.) to form films on various types of substrates. For the targets, pure Ge, pure Te and a pure element M (Al, Si, Cu, In, or Sn) or binary alloys (Ge-M, Te-M, and Ge—Te alloy) are used for multitarget sputtering to form films while changing the film forming output to adjust the concentration or ternary alloy targets (Ge-M-Te alloy) prepared in advance are used to form films. Further, in accordance with need, various types of pure targets which are selected from Al, Si, P, Cu, In, and Sn are used for multitarget sputtering or alloy targets adjusted in ingredients in advance are used to form films while suitably adjusting the film forming output to adjust the ingredients. Further, regarding the addition of N and O, it is possible to perform reactive physical vapor deposition to form a film while adjusting the flow rates of $N_2$ gas, $O_2$ gas, or $N_2/O_2$ mixed gas. Here, the substrate temperature at the time of formation can be changed from room temperature to 500° C. in accordance with need. When the substrate temperature is lower than the crystallization temperature of the material created, the material exhibits an amorphous phase, while when the substrate temperature is higher than the crystallization temperature, the material exhibits a crystal phase.

Examples

FIGS. 1A and 1B are views which show the compositions of phase-change materials according to various examples of the present invention and their physical properties in a table form. Below, the present invention will be described in further detail while referring to FIGS. 1A and 1B. Note that, in FIGS. 1A and 1B, to facilitate understanding of the present invention, Comparative Examples 1 to 5 which have compositions different from the scope of the present invention are shown. The materials shown in the illustrated Examples 1 to 32 basically have the composition of $Ge_xM_yTe_{100-x-y}$. M shows one type of element which is selected from the group which comprises Al, Si, Cu, In, and Sn. Here, 40 (at %)≤x+y≤60 (at %). In the table of FIGS. 1A and 1B, the atomic concentration of Te is shown, but this also includes impurities which are unavoidably contained in the film forming materials. Normally, such unavoidable impurities are on the order of several ppm to tens of ppm and therefore do not have a major effect on the physical properties of the phase-change material after formation. In several examples of Examples 1 to 32, one or more elements L which are selected from the group which comprises N, O, Al, Si, P, Cu, In, and Sn were added. The additional elements L were added to the phase-change material in the form of $Ge_xM_yL_zTe_{100-x-y-z}$. The value of z was selected so that 40 (at %)≤x+y+z≤60 (at %) and was in the range of 0.1 to 30.0 (at %).

The samples for measurement of physical properties were formed by forming thin films which have the compositions of Examples 1 to 32 and Comparative Examples 1 to 5 by an RF sputtering apparatus on substrates to 200 nm. Further, in Examples 1 to 21, for the purpose of preventing diffusion of the elements formed into films at the measurement tests into the $SiO_2$, substrates comprised of $SiO_2$/Si substrates on which diffusion barrier layers comprised of Mn oxides are formed by chemical vapor deposition (CVD) were used. For the targets, pure elements M, GeTe alloy, pure Te, and in accordance with need various types of pure element targets were used to change the film forming outputs of the targets and prepare amorphous phase samples of various types of compositions. Further, the samples of Examples 8, 13, 14, and 16 were prepared by reactive sputtering while running $O_2$ or $N_2$ gas through the inside of the chamber. Furthermore, the sample of Example 18 was prepared using a CuP target.

Examples 22 to 32 show cases where Cu is selected as the element M and Si is selected as the element L. The materials of Examples 22 to 32, like Examples 1 to 21, were formed by using an RF sputtering apparatus to form films on substrates to 200 nm, but for the substrates, $SiO_2$/Si substrate were used. For the targets, in accordance with need, $Ge_1Cu_2Te_3$ alloy targets, $Si_2Te_3$ alloy targets, $Si_1Cu_2Te_3$ alloy targets, and pure Si targets were used. Simultaneously, sputtering was used to form amorphous phase thin films which have various types of compositions.

FIGS. 1A and 1B show the crystallization temperature Tc (° C.), the melting point Tm (° C.), the activation energy of crystallization of the amorphous phase (eV), and the electrical resistance ratio ΔR between the amorphous phase and crystal phase of materials having various compositions. Here, the crystallization temperature and electrical resistance ratio of the amorphous phase and crystal phase were measured by measurement of the electrical resistance in the process of temperature elevation using the two-terminal method (temperature elevation rate: 9.2° C./min), while the melting point was measured using a differential scan calorimeter (10° C./min).

Further, Example 1 to Example 32 and Comparative Examples 1 to 5 were found by the Kissinger plot method which is shown by the following formula from the crystallization temperature which is obtained by measuring the activation temperature at which the amorphous phase crystallizes while changing the temperature elevation rate between 2 to 50° C./min.

$$\ln(\alpha/(Tc)^2) = -Ea/kTc + \text{Const.}$$

where $\alpha$: temperature elevation rate, Tc: crystallization temperature, Ea: activation energy, and k: Boltzmann constant.

The curves A to C of FIG. 2A show the changes in electrical resistance at the time of temperature elevation obtained by the two-terminal method for the samples of Examples 10 and 12 and Comparative Example 2. As will be understood from FIG. 2A, in the amorphous phase, a high electrical resistance is exhibited and the resistance rapidly decreases along with crystallization. Here, the crystallization temperature Tc was made the temperature at which the electrical resistance starts to rapidly decrease (shown by the arrow in the figure). Further, for Example 12, the electrical resistance curve R at the time of temperature reduction was also shown, but for each sample, in the same way as Example 12, it was learned that the electrical resistance does not change much at all in the process of temperature reduction after crystallization. Therefore, the electrical resistance ratio of each sample was made the ratio of the "the electrical resistance of the amorphous phase at room temperature" and "the electrical resistance of the crystal phase at a temperature which is 50° C. higher than the crystallization temperature".

Figure 2B:
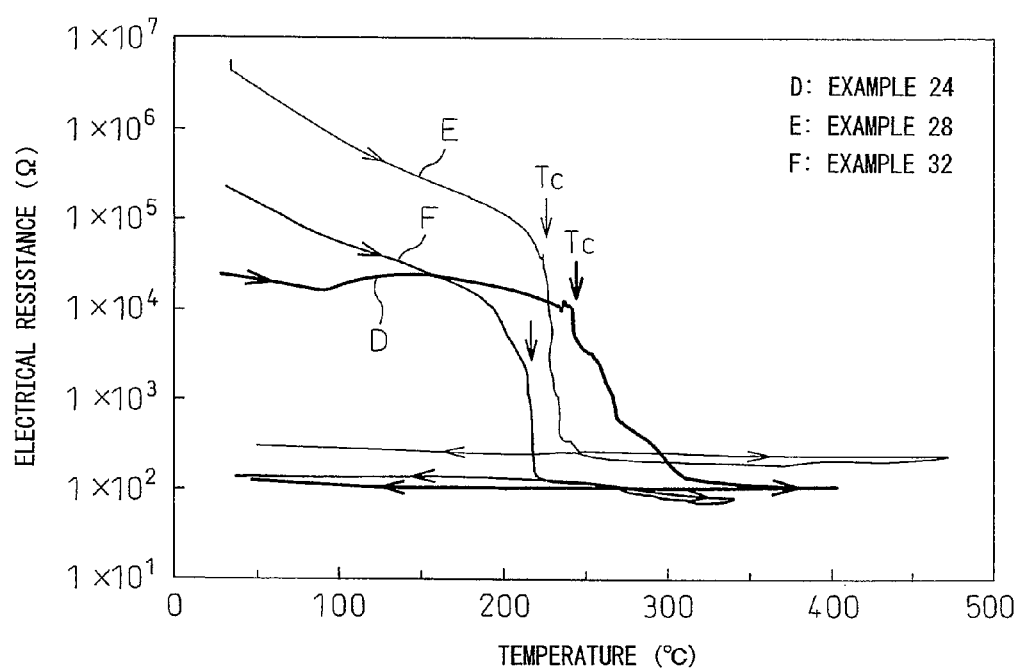
FIG. 2B is a graph which shows temperature dependencies of electrical resistances of thin films of phase-change materials according to various embodiments of the present invention.

Curves D to F of FIG. 2B show the changes in electrical resistance at the time of temperature elevation and temperature reduction obtained by the two-terminal method in the same way as the case of FIG. 2A for the samples of Examples 24, 28, and 32 which are shown in FIG. 1. In the same way as the case of FIG. 2A, at each curve, the temperature at which the electrical resistance starts to rapidly fall was made the crystallization temperature Tc.

As shown in FIGS. 1A and 1B, the phase-change materials of Example 1 to Example 32 both have 190° C. or higher crystallization temperatures. Further, the activation energy of crystallization was a high 3.0 eV or more in all materials. It is learned that these are materials extremely excellent in thermal stability of the amorphous phase. Furthermore, these materials all exhibit $10^2$ or more electrical resistance ratios (ΔR) along with crystallization. Further, regarding the melting point Tm as well, each was in the 700° C. range or lower. It is learned it was sufficiently low.

In particular, Examples 9 to 18 and 22 to 32 including Cu as the element M have low melting points and relatively high crystallization temperatures Tc (200° C. or more) and large activation energies (3 eV or more). Therefore, it is learned that these materials have large possibilities as materials for phase-change type nonvolatile memory devices. Further, it is learned that Examples 5 to 8 including Si as the element M have extremely high crystallization temperatures Tc.

Furthermore, Example 28, regardless of the fact the melting point was an extremely low 500° C. or so, had a 200° C. or higher crystallization temperature Tc and $10^4$ or higher electrical resistance ratio (ΔR). Therefore, it is learned that it has large possibilities as a material for a phase-change type nonvolatile memory device. Therefore, for the sample of Example 28, several temperatures of the crystallization temperature Tc or less were selected, isothermal retention tests were run for those temperatures, and the thermal stability of the amorphous phase was evaluated.

Figure 3:
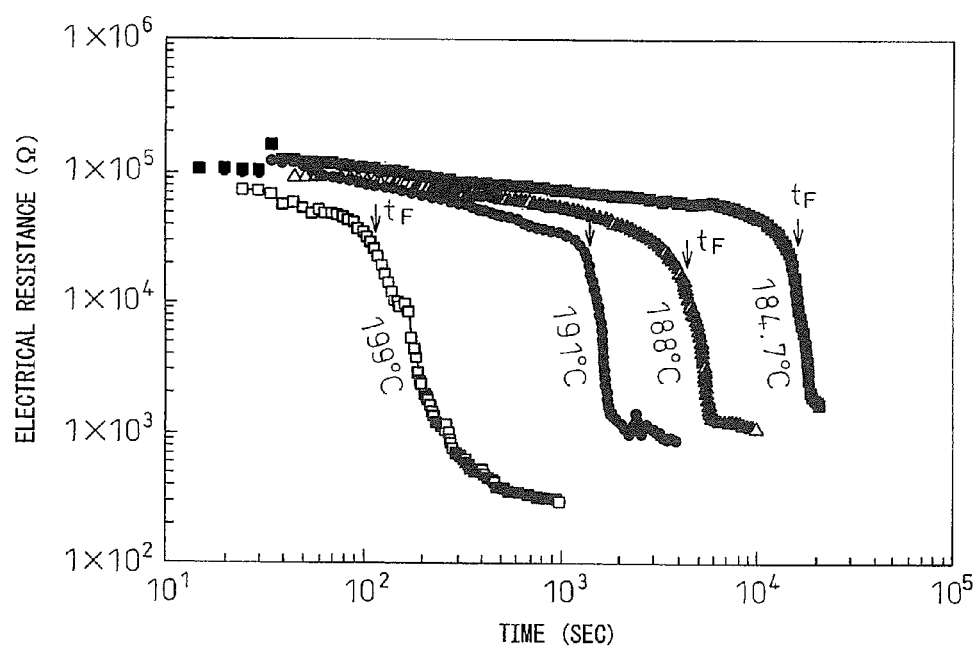
FIG. 3 is a graph which shows the changes in electrical resistance when holding an equal temperature in Example 28 which is shown in FIG. 1B.

FIG. 3 is a graph which shows the results of the isothermal retention tests which were run for the sample of Example 28. As shown in the figure, four types of temperatures lower than the crystallization temperature Tc, that is, 184.7° C., 188° C., 191° C., and 199° C., were selected and the changes in electrical resistance along with the elapse of time when holding the sample at the same temperature at those temperatures were examined. In the case of each temperature, a rapid drop in the electrical resistance value accompanying crystallization of the amorphous phase was observed along with the elapse of time.

Normally, an amorphous phase crystallizes along with being held at the same temperature for a long period of time even at less than the crystallization temperature Tc. Crystallization of the amorphous phase at the crystallization temperature Tc at the phase-change material or less means failure of the PCRAM device. As explained also in the section on the background art, since 2011, the guaranteed operating temperature of a PCRAM device has been made 125° C. for 10 years. Therefore, at the time of the different isothermic retention tests in FIG. 3, the time during which the electrical resistance falls the most rapidly is defined as the failure time $t_F$. An attempt was also made to estimate the highest temperature by which the amorphous phase remains stable for 10 years, that is, the guaranteed operating temperature. Specifically, the time of the point where the differential value of the slant of the curve takes the maximum negative value is made the failure time $t_F$.

Figure 4:
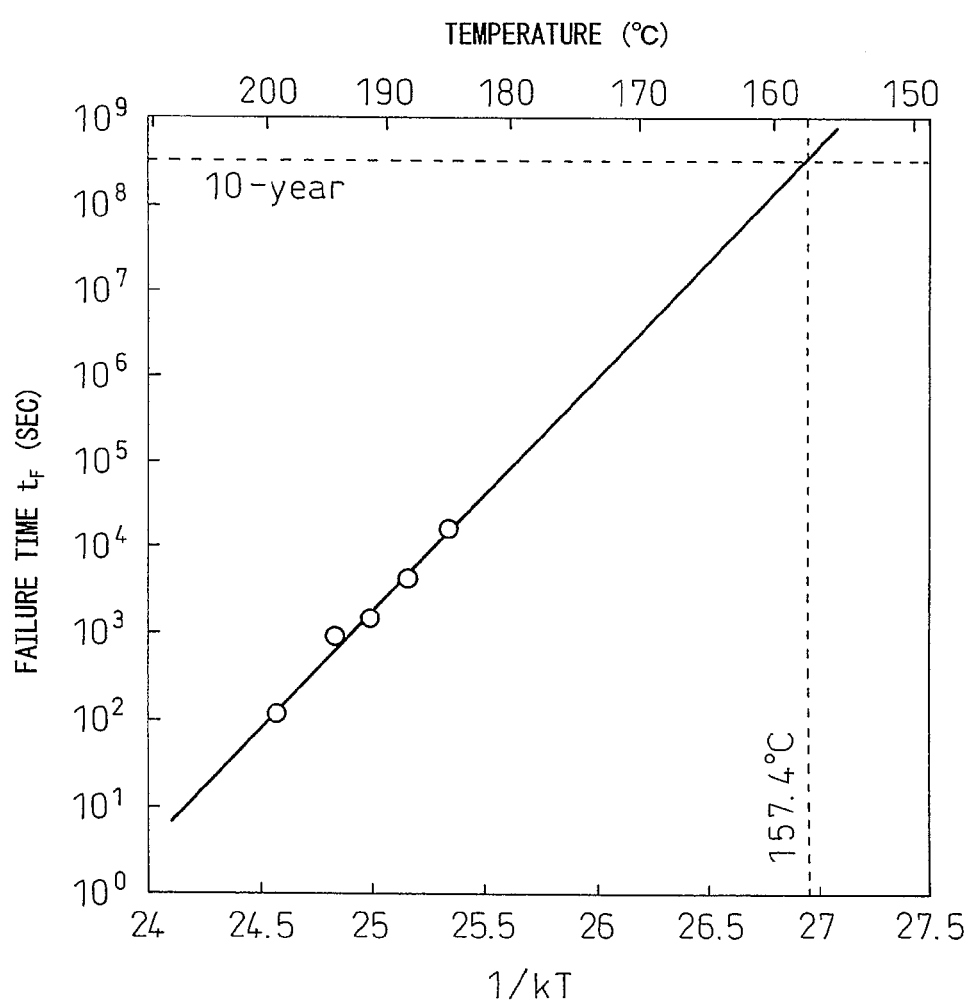
FIG. 4 is a graph which shows the relationship between a failure time $t_F$ and temperature which is found from the graph of FIG. 3.

FIG. 4 plots the failure time $t_F$ which is detected at FIG. 3 with respect to the function 1/kT of temperature. In FIG. 4, the ordinate indicates the failure time $t_F$, while the abscissa indicates 1/kT. Here, k is the Boltzmann constant, while T is the holding temperature. From this figure, by extrapolating the data point at each holding temperature up to 10 years and estimating the temperature at that time, it is possible to evaluate the guaranteed operating temperature. From the results, it is learned that the sample of Example 28 has a guaranteed operating temperature of 157.4° C. This temperature exceeds the demanded value of the guaranteed operating temperature starting 2011, that is, the value of 125° C. for 10 years. It is learned that this sample is also excellent in thermal stability.

Figure 5:
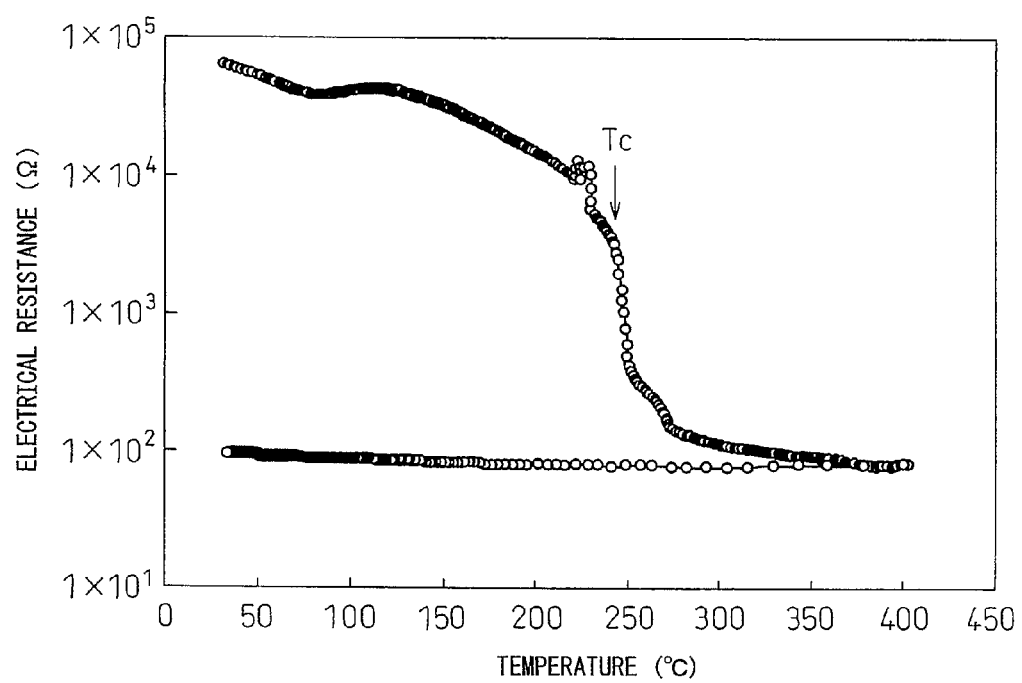
FIG. 5 is a graph which shows temperature dependencies of electrical resistances of samples of thin films of $Ge_{17.4}Cu_{30.7}Te_{51.9}$ of one embodiment of the present invention.

FIG. 5 is a graph showing the temperature dependency of the electrical resistance value of a $Ge_{17.4}Cu_{30.7}Te_{51.9}$ thin film (Ge:Cu:Te=1:1.76:2.98) prepared by a $Ge_{24}Cu_{33}Te_{43}$ alloy target. Here, the substrate was made $SiO_2/Si$. From the graph of FIG. 5, it is learned that the crystallization temperature Tc is a high 245° C.

Figure 6:
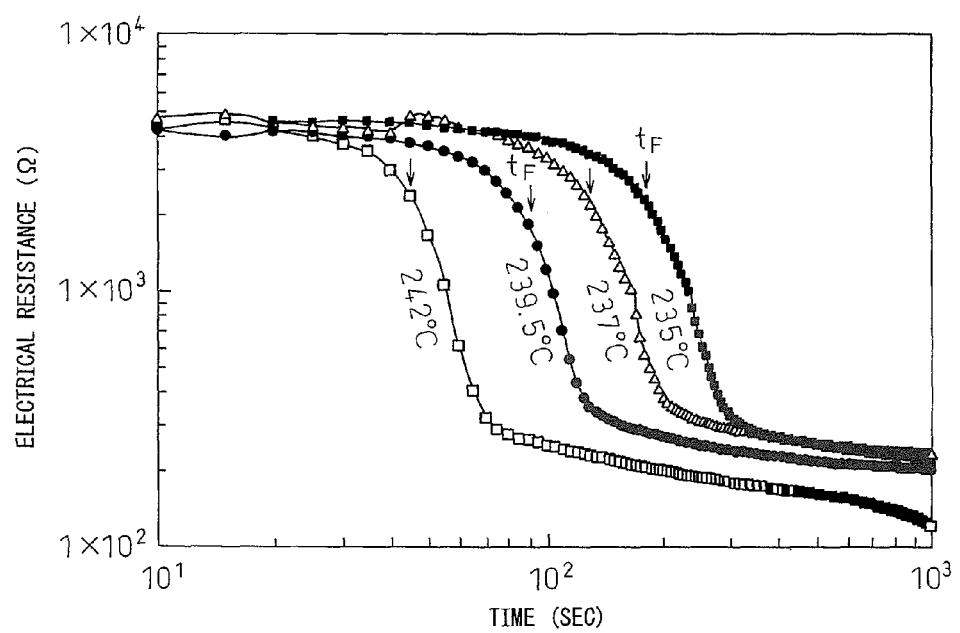
FIG. 6 is a graph which shows the changes in electrical resistance in holding an equal temperature in the sample of FIG. 5.
Figure 7:
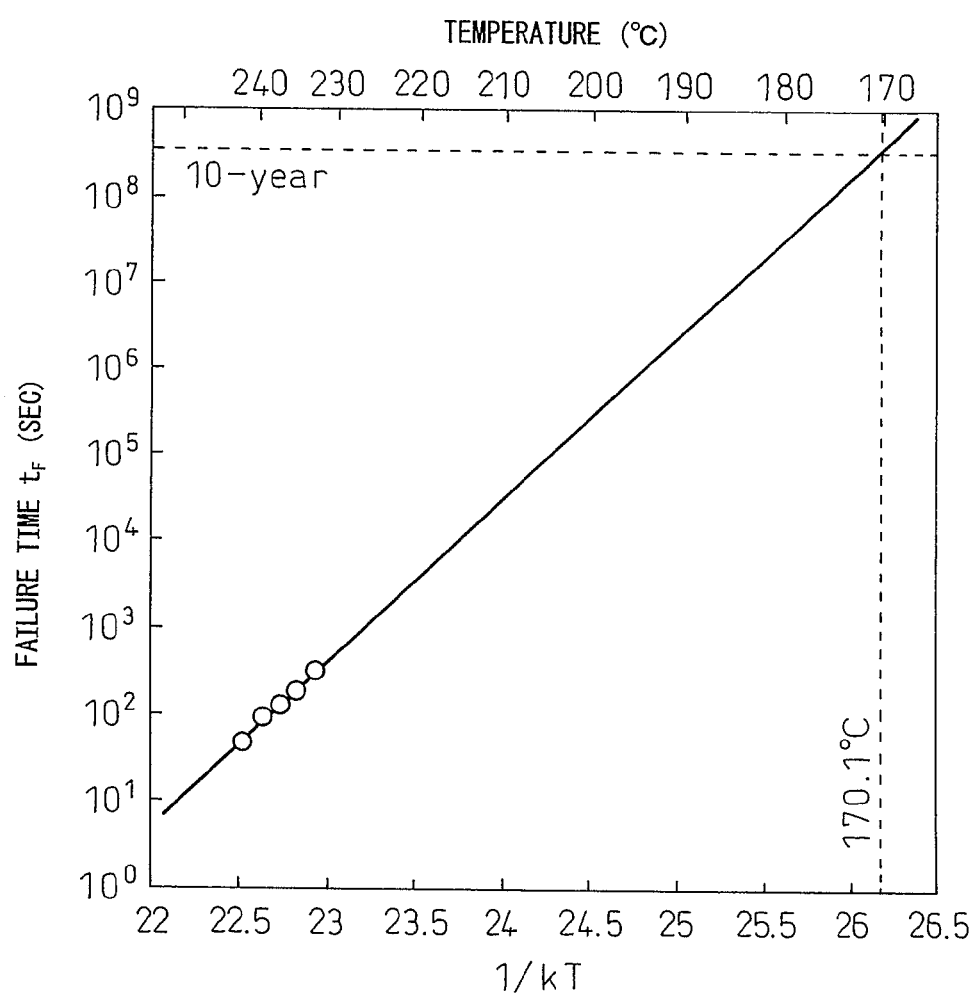
FIG. 7 is a graph which shows a relationship between a failure time $t_F$ and temperature which is found from the graph of FIG. 6.

FIG. 6 shows the results when running isothermic retention tests on the sample of FIG. 5 while selecting four types of temperatures of the crystallization temperature 245° C. or less, that is, 235° C., 237° C., 239.5° C., and 242° C. In FIG. 6, the ordinate expresses the electrical resistance value, while the abscissa expresses the time. From the results, in the same way as the case of the sample of Example 28, it was also possible to estimate the 10-year guaranteed operating temperature. As a result, as shown in FIG. 7, it was possible to estimate the guaranteed operating temperature of the sample as being 170.1° C. This temperature exceeds the demanded value of the guaranteed operating temperature starting 2011, that is, the value of 125° C. for 10 years. It is learned that this sample is also excellent in thermal stability. Note that, the samples of FIGS. 5 to 7 have ratios of atomic concentrations of Ge, Cu, and Te of about 1:2:3 or about the same as the atomic concentration ratio of Example 12 of FIG. 1. Therefore, from the result of FIG. 7, it is inferred that the sample of Example 12 is also excellent in thermal stability.

On the other hand, if viewing Comparative Examples 1 to 5, while they had $10^2$ or higher electrical resistance ratios, the crystallization temperatures were low 190° C. or less and the melting points were high, so it was learned that these materials are not well suited as phase-change type memory device materials. Furthermore, by referring to Comparative Example 3, it is learned that if the concentration x of Ge is, for example, a low 3.0 (at %), the crystallization temperature Tc is low and the result is not suitable as a phase-change material.

Figure 8:
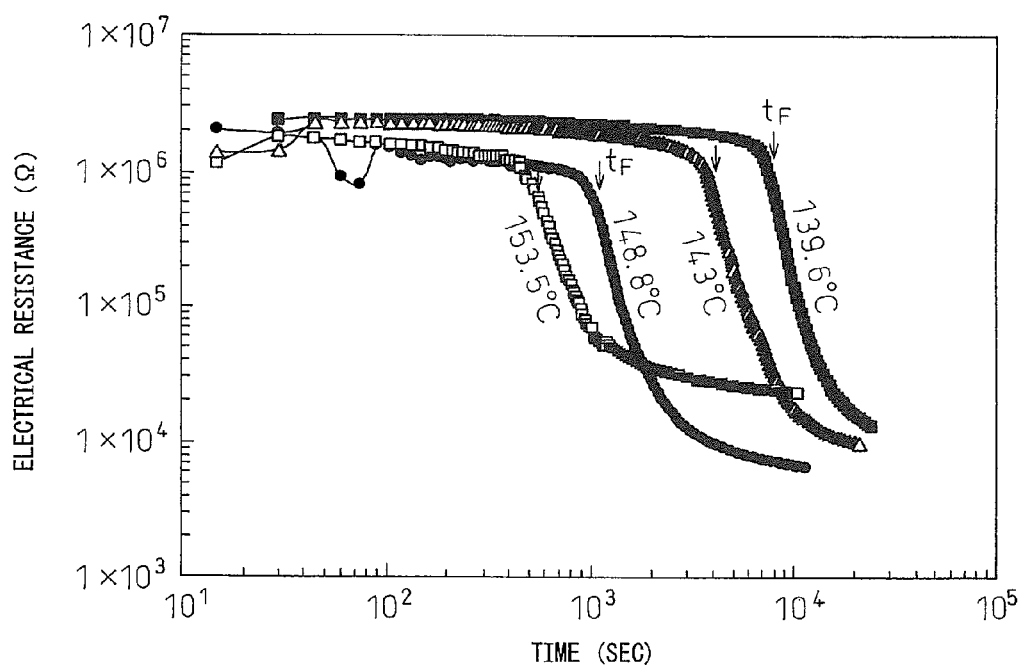
FIG. 8 is a graph which shows the changes in electrical resistance in holding an equal temperature in Comparative Example 2 which is shown in FIG. 1A.
Figure 9:
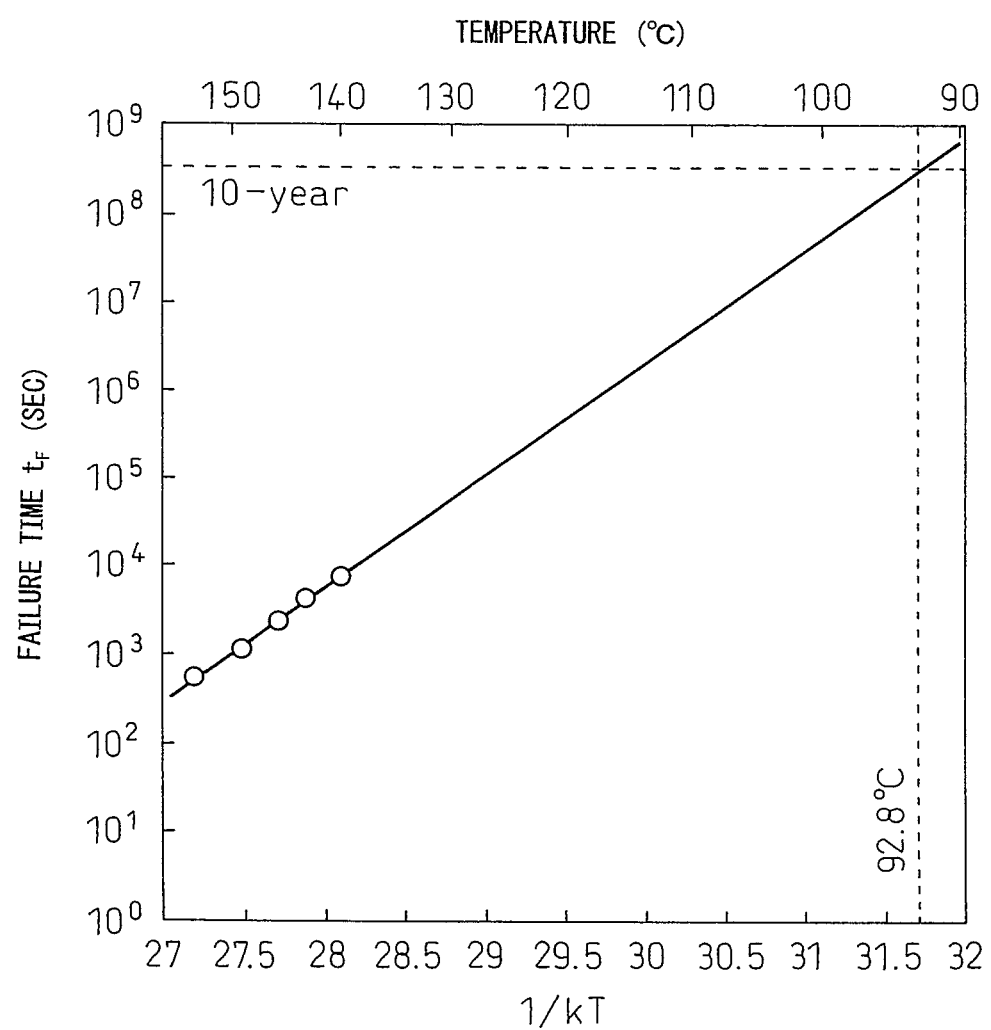
FIG. 9 is a graph which shows a relationship between a failure time $t_F$ and temperature which is found from the graph of FIG. 8.

FIG. 8 and FIG. 9 show the results of running isothermic retention tests on Comparative Example 2 in the same way as the case of Example 28 and estimating the 10-year guaranteed operating temperature. That is, FIG. 8 shows the results of isothermic retention tests on Comparative Examples 2 while selecting the four types of temperatures of 139.6° C., 143° C., 148.8° C., and 153.5° C. FIG. 9 shows the results of plotting the failure time $t_F$ for each temperature obtained by this test with respect to $1/kT$. If estimating the guaranteed operating temperature after 10 years based on the graph of FIG. 9, the result becomes 92.8° C. This temperature is far below the demanded value of the guaranteed operating temperature since 2011, that is, the standard of 125° C. for 10 years. It is learned that this sample is not suitable as a material for a PCRAM device.

Figure 10A:
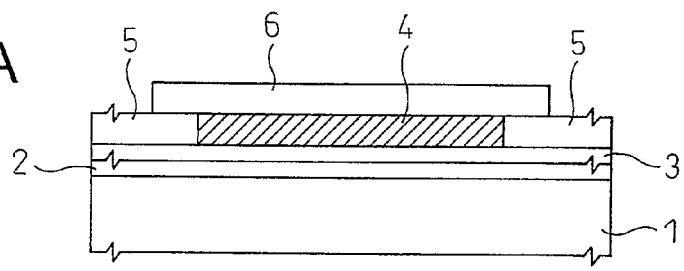
FIG. 10A is a schematic cross-sectional view of a phase-change type memory device according to one embodiment of the present invention.
Figure 10B:
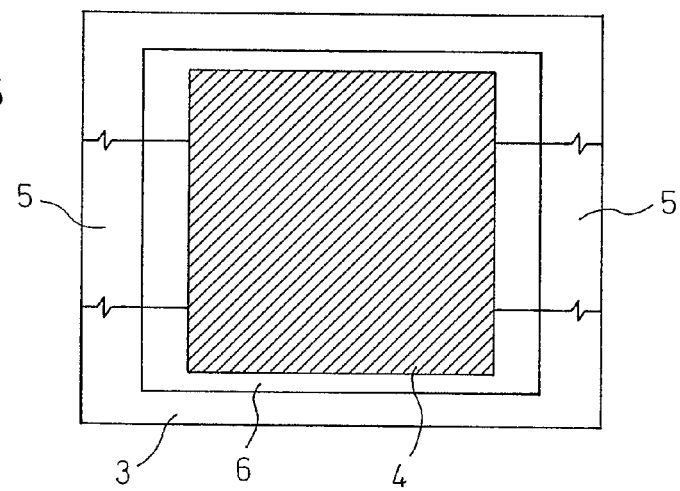
FIG. 10B is a plan view of a device which is shown in FIG. 10A.

A sample of the composition which is shown in Example 12 was used to investigate the conversion from a crystal phase to amorphous phase by application of pulse voltage. FIGS. 10A and 10B are a cross-sectional view and top view of a phase-change type nonvolatile memory cell structure used in the present experiment. In the same way as measurement of the electrical resistance by the two-terminal method, a Mn oxides/$SiO_2$/Si substrate was used as the substrate. In the figure, 1 indicates an Si semiconductor substrate, 2 an $SiO_2$ insulating layer, and 3 an Mn oxide diffusion barrier layer. First, first and second electrodes 5, 5 were formed on a substrate which has such a structure by photolithography and sputtering. For the electrode material, W (tungsten) was used. After that, photolithography and sputtering were used to form a film of the phase-change material to 200 nm so as to form a memory layer 4. Finally, the phase-change material part and part of the electrodes were covered by an $SiO_2$ layer 6 to obtain a memory cell.

The initial electrical resistance (crystal state) of the prepared phase-change material was $3.2\times10^2\Omega$. When applying a pulse voltage 10V of a pulse width of 10 ms, amorphization occurred and the electrical resistance rose to $5.3\times10^4\Omega$. From this, it was confirmed that data can be written and erased utilizing the Joule's heat of the phase-change material of the present invention.

Figure 11:
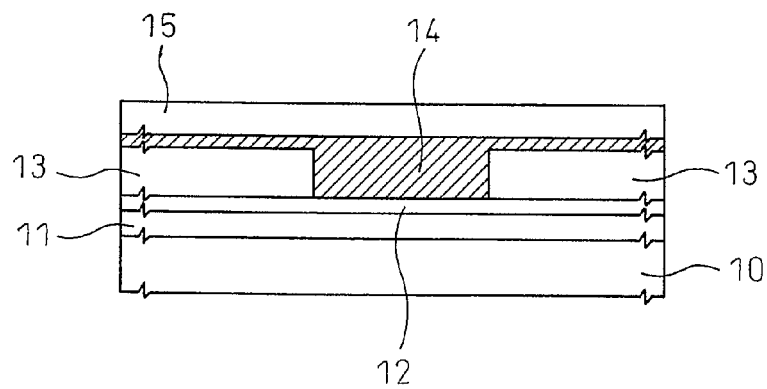
FIG. 11 is a cross-sectional view which shows the schematic structure of a phase-change type memory device according to another embodiment of the present invention.

Note that, the memory cell structure which is shown in FIGS. 10A and 10B comprises the memory layer 4 at the two ends of which first and second electrodes 5, 5 are formed, but as shown in FIG. 11, it is also possible to provide first and second electrode layers 11, 15 above and below the memory layer 14. In the examples of FIG. 11, 10 indicates an insulator (semiconductor), 11 a bottom electrode layer made of W etc. as a material, 12 a heat-generating electrode layer, and 13 an insulating layer which is comprised of $SiO_2$. While not illustrated, it is also possible to form a diffusion barrier layer of Mn oxides between the memory layer 14 and the insulating layer 13 and heat generating electrode layer 12.

INDUSTRIAL APPLICABILITY

The phase-change material of the present invention has a high crystallization temperature and has the advantageous effect that along with crystallization, a large change in electrical resistance is obtained. Therefore, it can also be utilized for a nonvolatile semiconductor memory using that phase-change material. Further, it can also be used for not only a semiconductor memory, but also, like GST, a DVD-RAM or other optical recording medium etc. which utilizes the reflectance of laser light at the crystal phase and amorphous phase. The present invention is not limited by these examples in any way. That is, other examples, aspects, etc. in the scope of the technical idea of the present invention are naturally included.

The invention claimed is:

1. A phase-change material which has a composition of the general chemical formula $Ge_xM_yTe_{100-x-y}$
    wherein M indicates one type of element which is selected from the group which comprises Al, Si, Cu, In, and Sn, x is 5.0 to 50.0 (at %) and y is 4.0 to 45.0 (at %) in range, and x and y are selected so that 40 (at %)≤x+y≤60 (at %).

2. A phase-change material which has a composition of the general chemical formula $Ge_xM_yL_zTe_{100-x-y-z}$
    wherein M indicates one type of element which is selected from the group which comprises Al, Si, Cu, In, and Sn, L is an element which is different from said M and at least one type of element which is selected from the group which comprises N, O, Al, Si, P, Cu, In, and Sn, x is 5.0 to 50.0 (at %) and y is 4.0 to 45.0 (at %) in range, and x and y are selected so that 40 (at %)≤x+y+z≤60 (at %).

3. A phase-change material as set forth in claim 1, wherein when said selected one type of element M is Cu, said y is 4.0 to 38.0 (at %).

4. A phase-change material as set forth in claim 1, wherein when said selected one type of element M is Al, said y is 4.0 to 15.0 (at %).

5. A phase-change material as set forth in claim 1, wherein when said selected one type of element M is Si, said y is 4.0 to 15.0 (at %).

6. A phase-change material as set forth in claim 2, wherein when said selected one type of element M is Cu and said element L is Si, said y is 10.0 to 38.0 (at %) and said z is 0.5 to 30 (at %).

7. A phase-change material as set forth in claim 1, wherein when said selected one type of element M is In, said y is 20.0 to 40.0 (at %).

8. A phase-change material as set forth in claim 1, wherein when said selected one type of element M is Sn, said y is 4.0 to 15.0 (at %).

9. A phase-change type memory device which is provided with a substrate, a memory layer which is formed by a phase-change material as set forth in claim 1 on a top of said substrate, and first and second electrodes for conduction to said memory layer.

10. A phase-change type memory device as set forth in claim 9 wherein said first and second electrodes are formed on said substrate in proximity to two ends of said memory layer.

11. A phase-change type memory device as set forth in claim 9 wherein said first electrode is formed by a bottom electrode layer and a heat-generating electrode layer which are formed on said substrate, and said second electrode is formed on said memory layer.

12. A phase-change type memory device as set forth in claim 10 wherein a diffusion barrier layer is formed between said memory layer and at least said substrate.

13. A phase-change material as set forth in claim 2, wherein when said selected one type of element M is Cu, said y is 4.0 to 38.0 (at %).

14. A phase-change material as set forth in claim 2, wherein when said selected one type of element M is Al, said y is 4.0 to 15.0 (at %).

15. A phase-change material as set forth in claim 1, wherein when said selected one type of element M is Si, said y is 4.0 to 15.0 (at %).

16. A phase-change material as set forth in claim 2, wherein when said selected one type of element M is In, said y is 20.0 to 40.0 (at %).

17. A phase-change material as set forth in claim 2, wherein when said selected one type of element M is Sn, said y is 4.0 to 15.0 (at %).

18. A phase-change type memory device which is provided with a substrate, a memory layer which is formed by a phase-change material as set forth in claim 2 on a top of said substrate, and first and second electrodes for conduction to said memory layer.

19. A phase-change type memory device as set forth in claim 18 wherein said first and second electrodes are formed on said substrate in proximity to two ends of said memory layer.

20. A phase-change type memory device as set forth in claim 18 wherein said first electrode is formed by a bottom electrode layer and a heat-generating electrode layer which are formed on said substrate, and said second electrode is formed on said memory layer.

21. A phase-change type memory device as set forth in claim 19 wherein a diffusion barrier layer is formed between said memory layer and at least said substrate.

* * * * *